(12) United States Patent
Yamaguchi et al.

(10) Patent No.: US 8,242,610 B2
(45) Date of Patent: Aug. 14, 2012

(54) SEMICONDUCTOR DEVICE AND METHOD OF FABRICATING SEMICONDUCTOR DEVICE

(75) Inventors: Tadashi Yamaguchi, Tokyo (JP); Kenji Nagasaki, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 302 days.

(21) Appl. No.: 12/461,089

(22) Filed: Jul. 31, 2009

(65) Prior Publication Data

US 2010/0044859 A1 Feb. 25, 2010

(30) Foreign Application Priority Data

Aug. 20, 2008 (JP) ................... 2008-211962

(51) Int. Cl.
*H01L 23/52* (2006.01)
*H01L 23/48* (2006.01)
*H01L 29/40* (2006.01)

(52) U.S. Cl. ............. 257/781; 257/E23.2; 257/778; 257/780; 257/786; 438/612

(58) Field of Classification Search .......... 257/E23.021, 257/E23.116, 678, 690, 758, 737, 787, 728, 257/738, 734, 778–781, 700, 788, E23.02, 257/786; 438/612, 613; 330/252, 307
See application file for complete search history.

(56) References Cited

U.S. PATENT DOCUMENTS

| 5,933,752 | A  | * | 8/1999  | Yanagida ............... 438/613 |
| 6,458,682 | B2 | * | 10/2002 | Watanabe .............. 438/612 |
| 6,952,048 | B2 | * | 10/2005 | Terui ..................... 257/678 |
| 6,998,710 | B2 | * | 2/2006  | Kobayashi et al. ..... 257/728 |
| 7,105,457 | B2 | * | 9/2006  | Takeuchi ............... 438/735 |
| 7,122,910 | B2 | * | 10/2006 | Nagasaki ............... 257/788 |
| 2006/0244540 | A1 | * | 11/2006 | Nakamura et al. ..... 330/307 |

FOREIGN PATENT DOCUMENTS

JP 2004-296775 A 10/2004

* cited by examiner

*Primary Examiner* — Chris Chu
(74) *Attorney, Agent, or Firm* — Rabin & Berdo, PC (57) ABSTRACT

There is provided a semiconductor device including a semiconductor substrate on which at least one electrode pad is formed, a rewiring layer connected to the electrode pad, and an encapsulation part which encapsulates the semiconductor substrate, the electrode pad being formed of a first region including a connection part connected to the rewiring layer and a second region other than the first region, the device including: an insulating film provided on the semiconductor substrate, having an opening at which the first region in the electrode pad is exposed, and covering the second region of the electrode pad, wherein the rewiring layer is connected to the first region of the electrode pad exposed at the opening, and extends across the insulating film so as to cover the second region of the electrode pad from above.

3 Claims, 10 Drawing Sheets

RELIABILITY TEST RESULT

| TEST ITEM | TEST CONDITIONS | TEST TIME | THE NUMBER OF FAILURES/THE NUMBER OF TESTS |
|---|---|---|---|
| THERMAL HUMIDITY BIAS TEST (THB) | Ta=85°C, RH=85% | 1000h | 0/22 |
| HIGHLY ACCELERATED STRESS TEST (HAST) | Ta=120°C, RH=85% | 1000h | 0/22 |
| PRESSURE COOKER TEST (PCT) | Ta=121°C, RH=85% 2 ATMOSPHERES | 100h | 0/22 |

SEMICONDUCTOR DEVICE AND METHOD OF FABRICATING SEMICONDUCTOR DEVICE

CROSS-REFERENCE TO RELATED APPLICATION

This application is based on and claims priority under 35 USC 119 from Japanese Patent Application No. 2008-211962 filed on Aug. 20, 2008, the disclosure of which is incorporated by reference herein.

BACKGROUND

1. Technical Field

The present invention relates to a semiconductor device and a method of fabricating a semiconductor device.

2. Related Art

In recent years, in the field of information devices typified by a cellular phone and a digital camera, miniaturization, higher density, and higher performance of a device are in demand. As a technique realizing them, a wafer level chip size package (hereinbelow, called W-CSP) for fabricating a semiconductor device built in those devices by the same package as that of the chip size is known. The W-CSP is a package of a new concept that all of assembling processes are completed in a wafer state. Since the chip area is effectively used by rewiring technique and external electrodes are formed in the entire surface of a semiconductor device, space of wire bonding as the conventional wiring method is unnecessary. Consequently, the area of a completed package has the same size as the chip size and, moreover, mounting to a mounting board is easy, so that the package is suitable for high-density mounting.

A semiconductor device having the W-CSP structure is fabricated by, for example, the following procedure. First, an insulating film is formed on a semiconductor substrate on which circuit devices such as transistors, electrode pads, and the like are formed. Next, an opening is formed in the insulating film to partially expose the electrode pad formed on the semiconductor substrate. A rewiring layer electrically connected to the electrode pad in the opening in the insulating film is formed on the insulating film. A mold resin is formed on the semiconductor substrate so as to cover the rewiring layer. After that, an opening is formed in the mold resin to partially expose the rewiring layer. Finally, an external connection terminal such as a solder bump is formed on the exposed rewiring layer. By the above processes, the semiconductor device having the W-CSP structure is completed.

In a process of fabricating a semiconductor substrate prior to execution of the above-described fabricating processes, an electric test for confirming a circuit operation is conducted. In the test process, a test is conducted by making a probe of a tester come into contact with the electrode pad formed on the semiconductor substrate. Consequently, there is a case that a projected probe mark is formed in the surface of the electrode pad. In the case where the electrode pad with which the test probe comes into contact and the electrode pad to which the rewiring layer is connected are provided independently of each other, the rewiring layer is not connected to the electrode pad for a test, so that the surface of the electrode pad for a test is covered with an insulating film. However, when a projected probe mark is formed in the surface of the electrode pad for a test, adhesion between the insulating film and the electrode pad deteriorates. When moisture or the like enters the package, the electrode pad for a test becomes corroded and, moreover, there is the possibility that an internal circuit formed on the semiconductor substrate is also damaged.

Japanese Patent Application Laid-Open (JP-A) No. 2004-296775 describes that the problem can be solved by covering the electrode pad for a test with which a test probe comes into contact with the rewiring layer.

As the performances of information devices are becoming higher in recent years, there is a case that a wafer test is conducted plural times. In this case, the test probe comes into contact with the electrode pad plural times. The height of the projected probe mark formed in the surface of the electrode pad increases as the number of test times increases. In a circumstance that a probe mark having a relatively tall projection is formed in the surface of an electrode pad, when the structure that the electrode pad for a test is covered with the rewiring layer as described in JP-A No. 2004-296775 is employed, the following problem may occur. Generally, the rewiring layer covering the surface of the electrode pad is made of Cu or the like and formed by electrolytic plating. In the case of forming the rewiring layer by electrolytic plating, a plating seed layer has to be formed below the rewiring layer. The plating seed layer can be formed by sputtering. However, when a projected probe mark is formed in the surface of the electrode pad and, moreover, the projection is tall, coverage of the plating seed layer deteriorates. Since the rewiring layer cannot be formed in a part where the plating seed layer is missing, it becomes difficult to completely cover the probe mark formed in the electrode pad with the rewiring layer. A structure that the electrode pad and a mold resin are in direct contact via the projection of the probe mark is resulted. In such a structure, when moisture or the like enters the package, corrosion in the electrode pad progresses via the projection of the probe mark. Further, the adverse influence may be exerted on the operational characteristics of an integrated circuit formed on the semiconductor substrate, and it is an issue from the viewpoint of reliability. On the other hand, a structure of thickly forming an insulating film so as to completely cover a projected probe mark formed in the surface of the electrode pad may be also employed. In this case, however, it is difficult to form a contact hole for connecting the rewiring layer and the electrode pad.

SUMMARY

The present invention has been achieved in consideration of the above-described points, and an object of the invention is to provide a semiconductor device and a method of fabricating a semiconductor device capable of assuring high reliability even in the case where a relatively large probe mark is formed in the surface of an electrode pad in an electric test on a semiconductor substrate performed as a preliminary step for a process of fabricating a W-CSP.

One aspect of the present invention provides a method of fabricating a semiconductor device including a semiconductor substrate on which at least one electrode pad is formed, a rewiring layer connected to the electrode pad, and an encapsulation part which encapsulates the semiconductor substrate, the electrode pad being formed of a first region including a connection part connected to the rewiring layer and a second region other than the first region, the method including:

forming an insulating film on the semiconductor substrate so as to cover the electrode pad;

forming, in the insulating film, an opening at which the first region of the electrode pad is exposed;

forming, on the insulating film, the rewiring layer connected to the electrode pad exposed at the opening so as to cover the second region of the electrode pad from above; and forming a resin encapsulation part using a resin so as to cover the insulating film and the rewiring layer.

Another aspect of the present invention provides a method of fabricating a semiconductor device including a semiconductor substrate on which at least one electrode pad is formed, a rewiring layer connected to the electrode pad, and an encapsulation part which encapsulates the semiconductor substrate, the electrode pad being formed of a first region including a connection part connected to the rewiring layer and a second region having a projection formed by contact of a probe, the method including:

forming an insulating film on the semiconductor substrate so as to cover at least the first region of the electrode pad and a lower part of the projection;

forming, in the insulating film, an opening at which the first region in the electrode pad is exposed;

forming, on the insulating film, the rewiring layer connected to the first region in the electrode pad exposed at the opening so as to cover an upper part of the projection projected from a surface of the insulating film; and forming a resin encapsulation part using a resin so as to cover the insulating film and the rewiring layer.

Here, the formation of the rewiring layer may includes:

sequentially depositing a barrier layer and a plating seed layer so as to cover the first region of the electrode pad exposed at the opening in the insulating film and the upper part of the projection projected from the surface of the insulating film; and forming a conductive layer by electrolytic plating on the plating seed layer.

The present invention provides a semiconductor device including a semiconductor substrate on which at least one electrode pad is formed, a rewiring layer connected to the electrode pad, and an encapsulation part which encapsulates the semiconductor substrate, the electrode pad being formed of a first region including a connection part connected to the rewiring layer and a second region other than the first region, the device including:

an insulating film provided on the semiconductor substrate, having an opening at which the first region in the electrode pad is exposed, and covering the second region of the electrode pad, wherein the rewiring layer is connected to the first region of the electrode pad exposed at the opening, and extends across the insulating film so as to cover the second region of the electrode pad from above.

Further, the present invention provides a semiconductor device including a semiconductor substrate on which at least one electrode pad is formed, a rewiring layer connected to the electrode pad, and an encapsulation part which encapsulates the semiconductor substrate, the electrode pad being formed of a first region including a connection part connected to the rewiring layer and a second region having a projection formed by contact of a probe, the device including:

an insulating film provided on the semiconductor substrate, having an opening at which the first region of the electrode pad is exposed, and covering at least a lower part of the projection, wherein the rewiring layer is connected to the first region of the electrode pad exposed at the opening and extends across the insulating film so as to cover an upper part of the projection projected from a surface of the insulating film.

In the semiconductor device and the method of fabricating a semiconductor device of the invention, not only the insulating film but also the rewiring layer are formed above the test region in the electrode pad with which the test probe comes into contact in the process of testing the semiconductor substrate. Consequently, even in the case where a projected probe mark having relatively large height is formed in the test region in the electrode pad and the tip of the projection of the probe mark projects from the surface of the insulating film, the part is covered with the rewiring layer. Therefore, direct contact between the electrode pad and the insulating resin via the projection of the probe mark can be prevented. Even in the case where moisture enters the package, progress of corrosion of the electrode pad can be suppressed, so that high reliability can be assured.

In addition, since at least a lower part of the projected probe mark is covered with the insulating film, a part to be covered with the rewiring layer is limited to a tip portion of the probe mark. Therefore, even in the case where the height of the projection of the probe mark increases, the tip portion of the probe mark projected from the insulating film can be reliably covered with the rewiring layer.

BRIEF DESCRIPTION OF THE DRAWINGS

FIGS. 5-a1, 5-a2, 5-b1, and 5-b2 are plan views showing pattern variations of a probe mark formed in an electrode pad in the semiconductor device as the embodiment of the invention;

DETAILED DESCRIPTION

Embodiments of the present invention will be described below with reference to the drawings. In the drawings, the same reference numerals are designated to substantially the same or equivalent components.

Figure 1A:
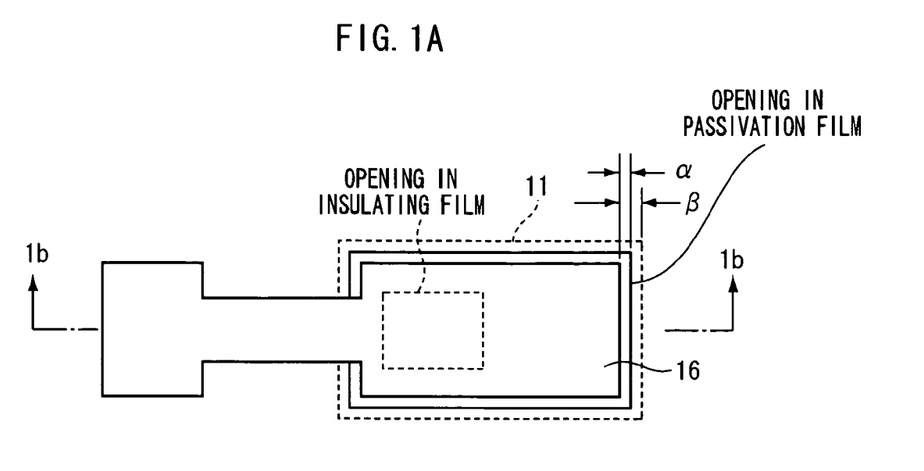
FIG. 1A is a plan view showing the configuration of an electrode pad formation part in a semiconductor device as an embodiment of the invention.
Figure 1B:
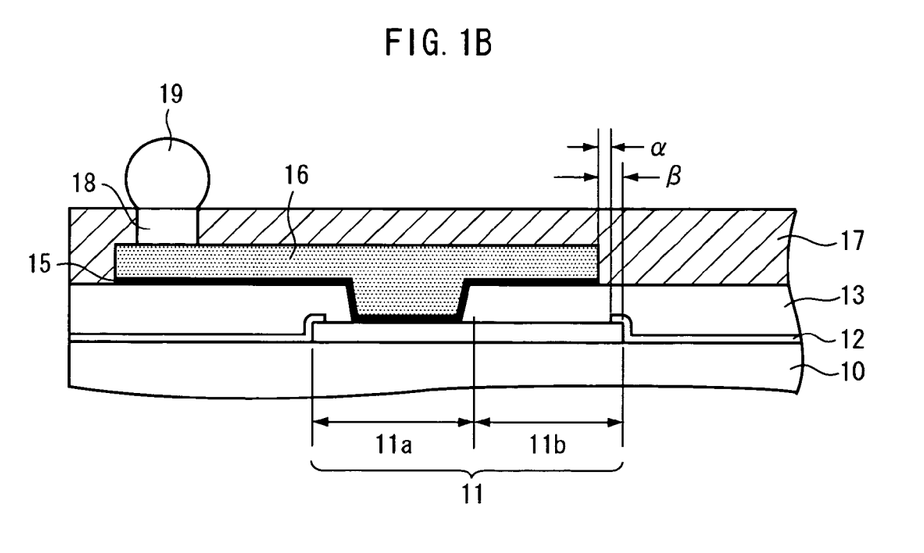
FIG. 1B is a cross section taken along line 1b-1b in FIG. 1A.

FIG. 1A is a plan view showing the configuration of an electrode pad formation portion in a semiconductor device as an embodiment of the invention. FIG 1B is a cross section taken along line 1b-1b in FIG. 1A. In FIG. 1A, components such as a solder bump 19, a columnar electrode 18, a mold resin 17, and the like which are shown in FIG 1B are not illustrated.

A semiconductor substrate 10 is, for example, a single crystalline silicon substrate. On the surface, circuit devices such as transistors and resistors are formed. By the circuit devices, an integrated circuit is formed. On the surface of the semiconductor substrate 10, an electrode pad 11 made of Al or the like electrically connected to the integrated circuit is formed. The electrode pad 11 has a rectangular shape in which a contact region 11a (first region) and a test region 11b (second region) are integrally and continuously formed. The contact region 11a is a region including a contact portion to be connected to a rewiring layer 16. The test region 11b is a region including a portion with which a test probe comes into contact at the time of electric testing performed in process of fabricating the semiconductor substrate 10. Specifically, in the electrode pad 11, a predetermined region for making the test probe come into contact in process of testing the semiconductor substrate 10 is defined. With a part in which the rewiring layer and the contact part are formed, the test probe does not come into contact. The contact region 11a as one of the two regions in the electrode pad 11 is disposed in a position closer to the solder bump 19 corresponding to the electrode pad 11. With the arrangement, the wiring length of the rewiring layer 16 connecting the contact part and the solder bump 19 can be made shorter, and the wiring resistance and wiring capacity can be reduced. In the embodiment, the region closer to the solder bump 19 in the electrode pad 11 is set as the contact region 11a, and the region closer to the solder bump 19 is set as the test region 11b.

On the surface of the semiconductor substrate 10, a passivation film 12 such as a silicon nitride film is formed. The passivation film 12 plays a role of protecting from mechanical damage caused when the semiconductor substrate is handled, chemical damage of a chemical and the like, an electrical damage such as electrostatic breakdown, and the like. The passivation film 12 has an opening above the electrode pad 11, and the electrode pad 11 is exposed from the opening.

On the electrode pad 11, an insulating film 13 made of, for example, PBO (Polybenzoxazoles), polyimide, or the like is formed with a thickness of about 1 to 10 μm. In the insulating film 13, an opening is formed in a part corresponding to the contact region 11a in the electrode pad 11. Since PBO has a characteristic of water absorption resistance higher than that of polyimide, in the case where the semiconductor device of the embodiment is used for a use requiring high reliability, it is preferable to form the insulating film 13 of PBO.

On the insulating film 13, a UBM (Under Bump Metal) film 15 and the rewiring layer 16 are sequentially formed. The UBM film 15 includes a barrier layer made of Ti or the like and a plating seed layer of Cu or the like. The barrier layer plays a role of preventing Cu as the component of the rewiring layer 16 from being diffused into the electrode pad 11 and the insulating film 13 and improving adhesion between the rewiring layer 16 and the electrode pad 11. As the material of the barrier layer, TiNi, TaNi, or the like can be also used. The plating seed layer is a conductive thin film as a base layer at the time of forming the rewiring layer 16 by the electrolytic plating method. By attaching an electrode to the plating seed layer and immersing the semiconductor substrate in a plating bath, the rewiring layer 16 is formed on the plating seed layer. Each of the barrier layer and the plating seed layer can be formed by sputtering or the like.

The rewiring layer 16 is made of Cu or the like and formed on the plating seed layer by electrolytic plating. The UBM film 15 and the rewiring layer 16 formed on the insulating film 13 are electrically connected to the electric pad 11 in the opening formed in the insulting film 13. That is, the UBM film 15 and the rewiring layer 16 are connected to the contact region 11b in the electrode pad 11. The rewiring layer 16 is a conductive wire for leading a signal or potential input/output to/from the electrode pad 11 formed on the surface of the. semiconductor substrate 10 to a position below the solder sump 19 as an external connection terminal. The rewiring layer 16 extends to a position below the solder bump 19 above the insulting film 13. The rewiring layer 16 extends so as to cover the test region 11b in the electrode pad 11 on the insulating film 13. That is, the rewiring layer 16 has a part extending so as to cover the test region 11b in the electrode pad 11 while sandwiching a part in contact with the electrode pad 11 and a part extending to a position below the part where the solder bump 19 is formed.

Desirably, the part extending toward the test region 11b side of the rewiring layer 16 ends at least in a position where a distance β from the end of the electrode pad 11 becomes smaller than 25 μm. That is, the distance β from the end on the test region 11b side of the electrode pad 11 shown in FIGS. 1A and 1B to the end of the rewiring layer 16 is preferably 25 μm or less. The distance α from the edge of the opening in the passivation film 12 existing on the electrode pad 11 shown in the diagram to the end of the rewiring layer 16 is preferably 20 μm or less. By extending the rewiring layer 16 to such a position, a projected probe mark formed in the test region 11b in the electrode pad 11 can be covered with the insulating film 13 and the rewiring layer 16. It is also desirable that the rewiring layer 16 ends in a relatively flat region before a stepped portion formed due to overlap between the electrode pad 11 and the passivation film 12. The reason is that, if the stepped portion is covered with the rewiring layer 16, a gap is created between the rewiring layer 16 and the insulating film 13 and an encapsulation resin 17. For example, when the device is used in a high-temperature state, the gap expands and it may destroy the device.

The top surface of the rewiring layer 16 and the insulating film 13 is covered with the encapsulation resin 17 such as epoxy resin. The encapsulation resin 17 is formed, for example, only on the surface on which the rewiring layer 16, the solder bump 19, and the like are formed, of the semiconductor substrate 10. The other surface of the semiconductor substrate 10 may be exposed. In the encapsulation resin 17, the columnar electrode (Cu post) 18 made of Cu or the like connected to an end of the rewiring layer 16 is buried. The top surface of the columnar electrode 18 is exposed from the top surface of the encapsulation resin 17, and the solder bump 19 is connected to the exposed surface of the columnar electrode 18. The solder bump 19 plays a role of an external connection terminal and serves as a part joined to the mounting board. Mounting onto the mounting board is performed by adhering the solder bump 19 to a conduction pattern of the mounting board by a reflow process.

As described above, in the semiconductor device of the embodiment, in the electrode pad 11, the contact region 11a to which the rewiring layer 16 is connected and the test region 11b with which the test probe comes into contact at the time of a wafer test are separately defined, and a probe mark is not formed in the contact region 11a. Therefore, inconveniences such that adhesion deteriorates in the joining part between the electrode pad 11 and the rewiring layer 16, and the rewiring layer cannot be formed uniformly can be avoided.

Figure 2A:
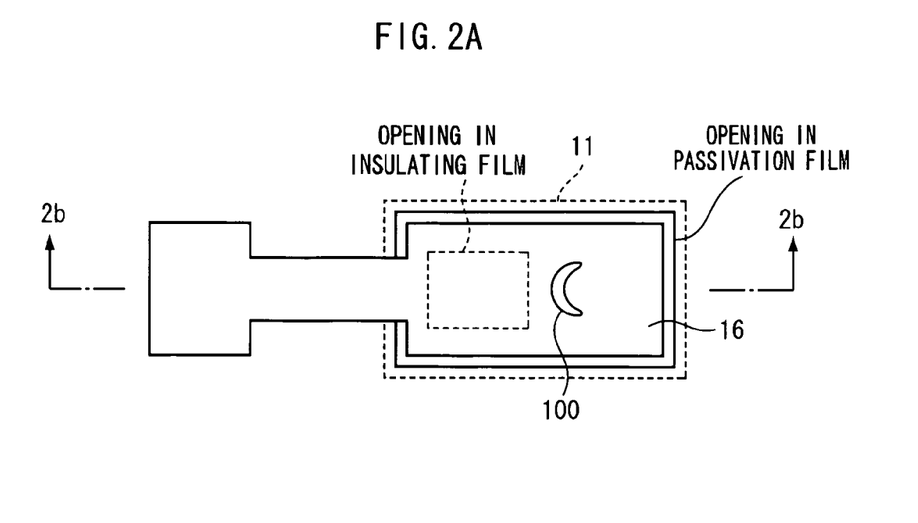
FIG. 2A is a plan view showing the configuration of the electrode pad formation part in the semiconductor device as an embodiment of the invention.
Figure 2B:
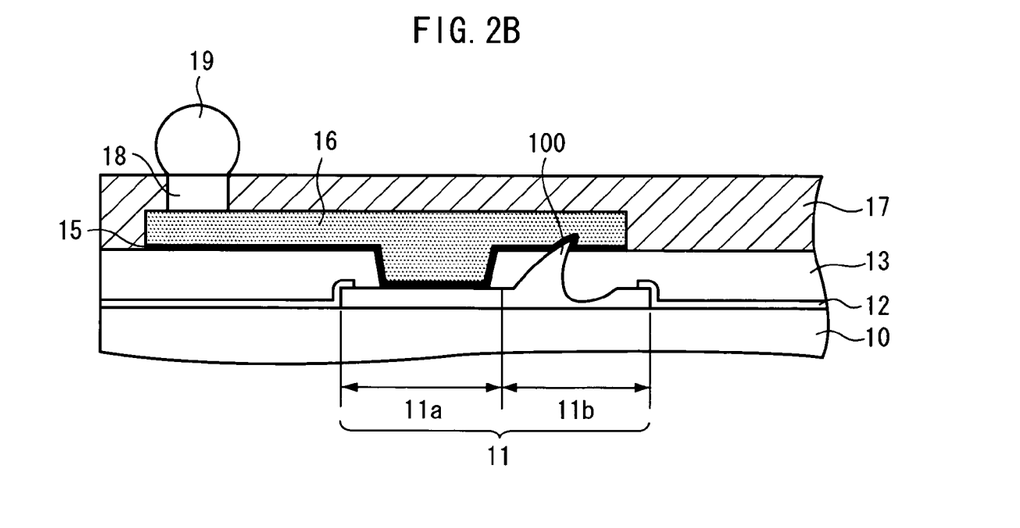
FIG. 2B is a cross section taken along line 2b-2b in FIG. 2A.

FIGS. 2A and 2B show an example of the structure of the semiconductor device as the embodiment in the case where a projected probe mark 100 is formed in the electrode pad 11 as a result of a wafer test performed in the process of fabricating the semiconductor substrate 10. FIG. 2A is a plan view showing the configuration of an electrode pad formation part in the semiconductor device. FIG. 2B is a cross section taken along line 2b-2b in FIG. 2A. In FIG. 2A, the components such as the solder bump 19, the columnar electrode 18, the mold resin 17, and the like shown in FIG. 2B are not illustrated. When an electric test is conducted plural times in the process of fabricating the semiconductor substrate 10, the test probe comes into contact with the electrode pad 11 repeatedly. The test region 11b in the electrode 11 rises due to the pressing force of the probe, and the projected probe mark 100 is formed. The height of the projection of the probe mark 100 increases as the number of tests increases. There is a case such that the projection penetrates the insulating film 13 having a thickness of, for example, about 5 μm and the tip of the projection projects from the surface of the insulting film 13. In this case, the lower part of the projection of the probe mark 100 is covered with the insulating film 13, so that only the upper part (tip portion) of the projection projects from the surface of the insulating film 13. Since the tip portion of the projection slightly projects from the surface of the insulating film 13, the tip portion is covered with the rewiring layer 16 extending to a position above the test region 11b in the electrode pad 11. That is, the projected probe mark 100 formed above the electrode pad 11 is completely covered with the insulating film 13 and the rewiring layer 16 to prevent the projected part from coming into direct contact with the encapsulation resin 17. Therefore, even in the case where moisture or the like enters the package, progress of corrosion of the electrode pad via the projected part can be prevented.

If the rewiring layer 16 is not formed above the test region 11b in the electrode pad 11, the probe mark 100 projected from the surface of the insulating film 13 comes into direct contact with the encapsulation resin 17. In the case where moisture or the like enters the package, corrosion of the electrode pad 11 via the tip portion of the probe mark 100 progresses. It may fluctuate the contact resistance between the electrode pad 11 and the rewiring layer 16 and, further, fluctuate the operational characteristics of the semiconductor device. That is, in the structure in which the test region 11b in the electrode pad 11 is covered only with the insulating film 13, if a projected probe mark having a height larger than the thickness of the insulating film 13 is formed in the test region 11b, it becomes difficult to assure reliability. Even if PBO having excellent water absorption resistance is used as the material of the insulating film 13, moisture is absorbed via the tip portion of the probe mark projected from the PBO film and corrosion of the electrode pad progresses. Therefore, the effect of introducing the PBO film deteriorates. In the embodiment, the case where the projected probe mark 100 penetrates the insulating film 13 is also assumed, and the structure is employed such that the rewiring layer 16 extends to a position above the test region 11b in the electrode pad 11 and, even in the case where the probe mark 100 projects from the surface of the insulating film 13, the projected part is covered with the rewiring layer 16. Thus, high reliability can be assured.

Figure 3:
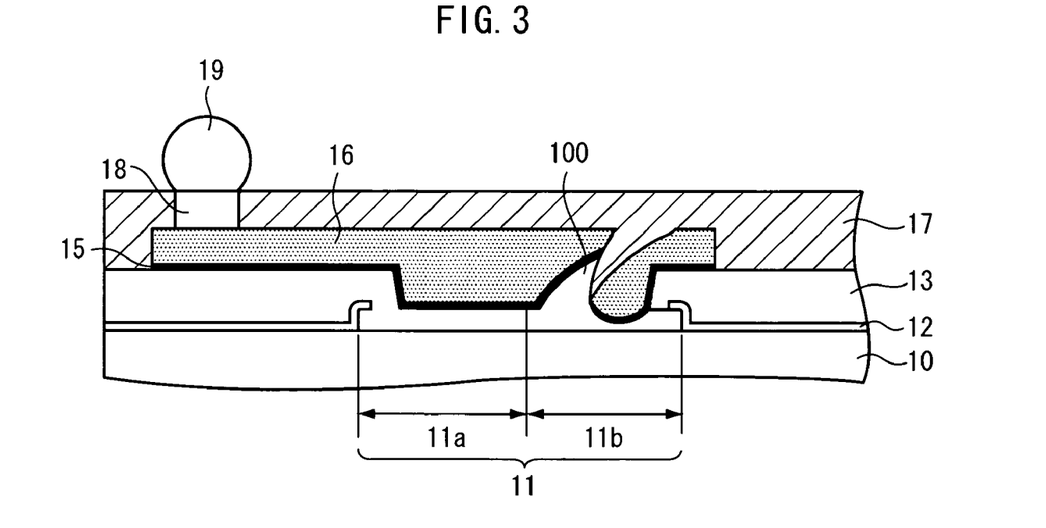
FIG. 3 is a cross section showing the configuration of a semiconductor device having a structure different from that of the embodiment of the invention.

Inconveniences assumed in the case where the insulating film 13 is not formed above the test region 11b in the electrode pad 11 different from the structure of the semiconductor device of the embodiment and the test region 11b is directly covered with the rewiring layer 16 will be described with reference to FIG. 3. In the semiconductor device having such a structure, when the projected probe mark 100 having a height similar to that in the case of FIG. 2 is formed in the test region 11b in the electrode pad 11, it becomes difficult to uniformly form the rewiring layer 16 above the electrode pad 11. That is, the probe mark 100 formed by the pressing force of the test probe has a shape that its middle part enters the inside as shown in FIGS. 2 and 3. It becomes difficult to deposit the UBM film 15 formed by sputtering or the like in the middle part of the projection of the probe mark 100. Since the rewiring layer 16 is formed by electrolytic plating using the UBM film 15 as a base layer, in a part where the UBM film 15 is not deposited, the rewiring layer 16 cannot be grown. Consequently, a gap as shown in FIG. 3 is formed in the rewiring layer 16, and the encapsulation resin 11 enters the gap. As a result, the projection of the probe mark 100 comes into contact with the encapsulation resin 17. In the case where moisture or the like enters the package, there is the possibility that corrosion of the electrode pad 11 progresses via the projection and the operational characteristics of the semiconductor device fluctuate.

In the embodiment, a structure is employed such that the insulating film 13 and the rewiring layer 16 are formed above the test region 11b in the electrode pad 11, a lower part of the projection of the probe mark 100 is covered with the insulating film 13, and only an upper part projected from the surface of the insulating film 13 is covered with the rewiring layer 16. With the structure, a part in which the UBM film 15 covers the probe mark 100 is limited to the tip of the projection. Consequently, the UBM film 15 can be uniformly formed in the part, and occurrence of a gap as shown in FIG. 3 in the rewiring layer 16 can be prevented.

Figure 4:
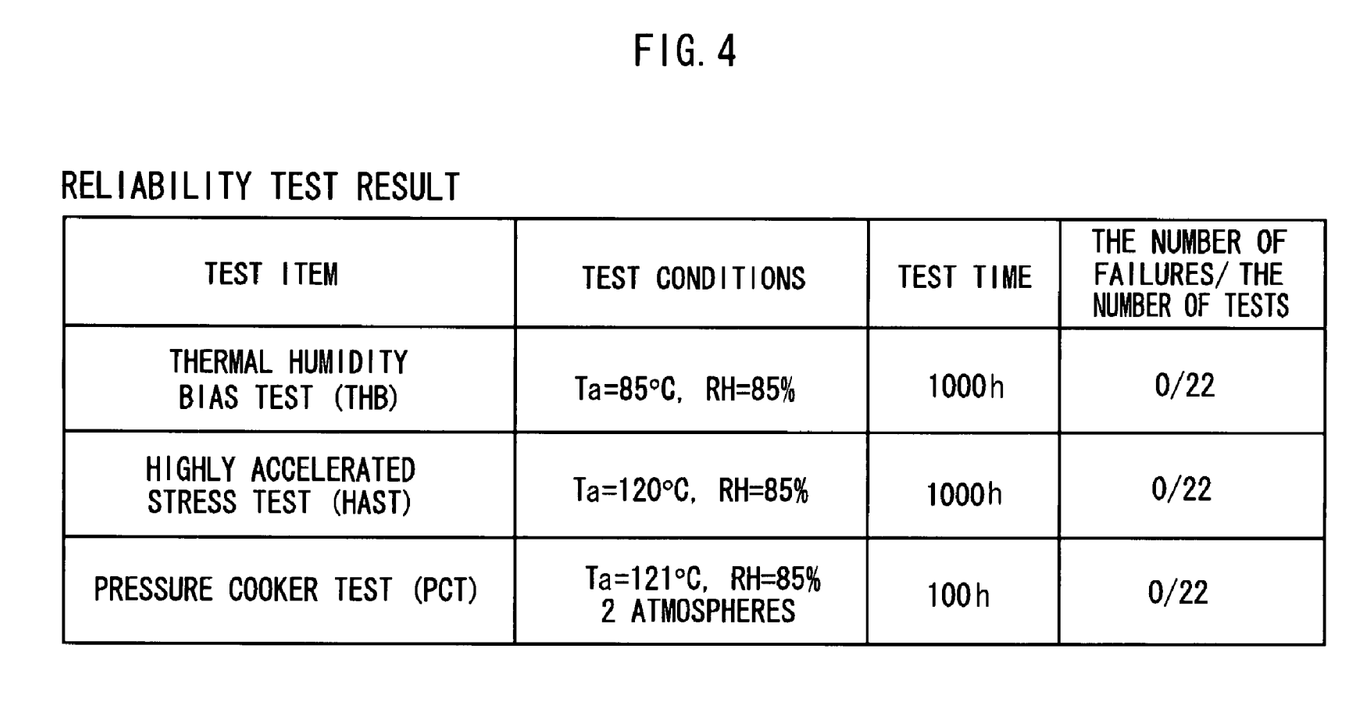
FIG. 4 is a diagram showing a reliability evaluation result of the semiconductor device as the embodiment of the invention.

FIG. 4 shows a result of reliability evaluation on the semiconductor device of the embodiment. In each of electrode pads 11 of all of evaluation samples, the projected probe mark 100 penetrating the insulating film 13 is formed as shown in FIG. 2. Test items are a thermal humidity bias test (THB), a highly accelerated stress test (HAST), and a pressure cooker test (PCT). All of the test items relate to humidity resistance of the semiconductor device. The number of test times per item was 22. The number of failures was zero in each of the test items. That is, even in the case where a probe mark having a projection penetrating the insulting film 13 is formed on the electrode pad 11, the tip of the projection is covered with the rewiring layer 16. Therefore, sufficient humidity resistance can be obtained, and high reliability can be realized.

Figure 5:
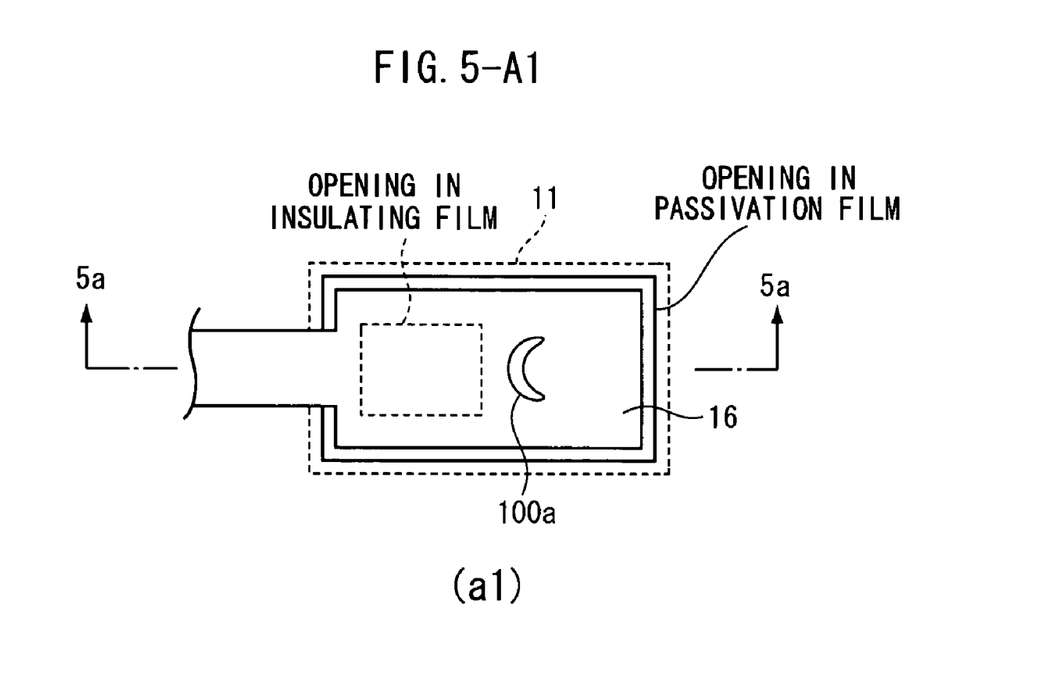

FIGS. 5-a1, 5-a2, 5-b1, and 5-b2 show variations of a probe mark formed in the test region 11b in the electrode pad 11 in the semiconductor device as the embodiment. FIG. 5-a1 is a top view of a first pattern, and FIG. 5-a2 is a cross section taken along line 5a-5a. FIG. 5-b1 is a top view of a second pattern, and FIG. 5-b2 is a cross section taken along line 5b-5b. In FIGS. 5-a2 and 5-b2, the components of the insulating film 13, the rewiring layer 16, and the like are not shown.

As shown in FIGS. 5-a1 and 5-a2, a probe mark 100a in the first pattern is formed in the electrode pad 11 connected to the rewiring layer 16 extending to the left side in the diagrams. It means that the solder bump 19 as an external connection terminal exists on the left side in the diagram, of the position where the electrode pad 11 is formed. In this case, from a viewpoint of shortening the length of the rewiring as much as possible, the left side of the electrode pad 11 is set as the contact region 11a, and the right side is set as the test region 11b. As shown in FIG. 5-a2, the test probe comes into contact with the test region 11b in the electrode pad 11 obliquely from the upper right side in the diagram. Therefore, the projected probe mark 100a in the first pattern is formed close to the contact region 11a in the electrode pad 11.

On the other hand, a probe mark 100b in a second pattern is formed in the electrode pad 11 connected to the rewiring layer 16 extending to the right side as shown in FIGS. 5-b1 and 5-*b*2. It means that the solder bump 19 as an external connection terminal exists on the right side in the diagram, of the position where the electrode pad 11 is formed. In this case, from a viewpoint of shortening the length of the rewiring as much as possible, the right side of the electrode pad 11 is set as the contact region 11*a*, and the left side is set as the test region 11*b*. As shown in FIG. 5-*b*2, the test probe comes into contact with the test region 11*b* in the electrode pad 11 obliquely from the upper right side in the diagram. Therefore, the projected probe mark 100*b* in the second pattern is formed in a position far from the contact region 11*a* in the electrode pad 11. In the semiconductor device of the embodiment, in any of the cases, the projected probe mark is covered with the insulating film 13 and the rewiring layer 16, so that reliability can be assured.

A method of fabricating the semiconductor device of the invention having the above structure will now be described with reference to FIGS. 6A to 6F. FIGS. 6A to 6F are cross sections of steps in the process of fabricating the semiconductor device according to the invention.

Figure 6A:
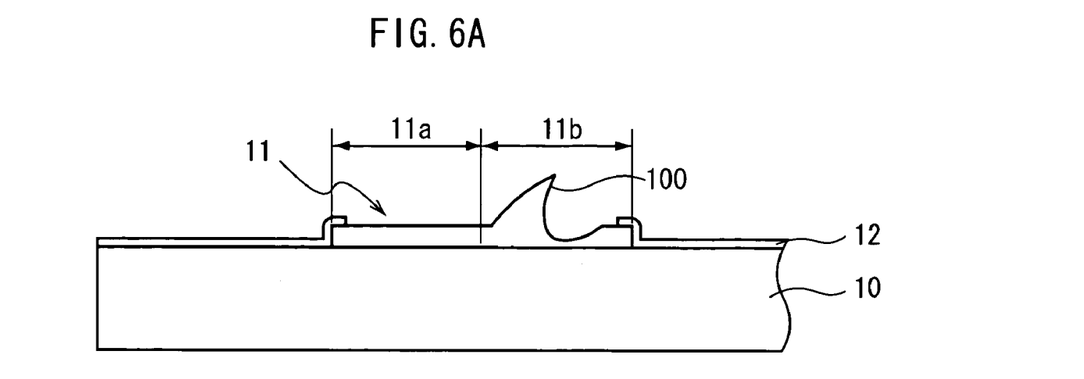
FIGS. 6A to 6F are cross sections of process steps in process of fabricating the semiconductor device as the embodiment of the invention.

First, the semiconductor substrate 10 on which a semiconductor device, the electrode pad 11, and the passivation film 12 are formed is prepared. The electrode pad 11 is made of the contact region 11*a* and the test region 11*b*. The test region 11*b* is subjected to an electric test plural times in a process of testing the semiconductor substrate 10 and, as a result, has a projected probe mark 100. The electrode pad 11 is formed by, for example, depositing an Al film on the semiconductor substrate 10 by sputtering and performing desired patterning in the Al film. The passivation film 12 is, for example, a silicon nitride film or the like and is formed by CVD or the like. The passivation film 12 has an opening above the electrode pad 11, and the electrode pad 11 is exposed from the opening (FIG. 6A).

Figure 6B:
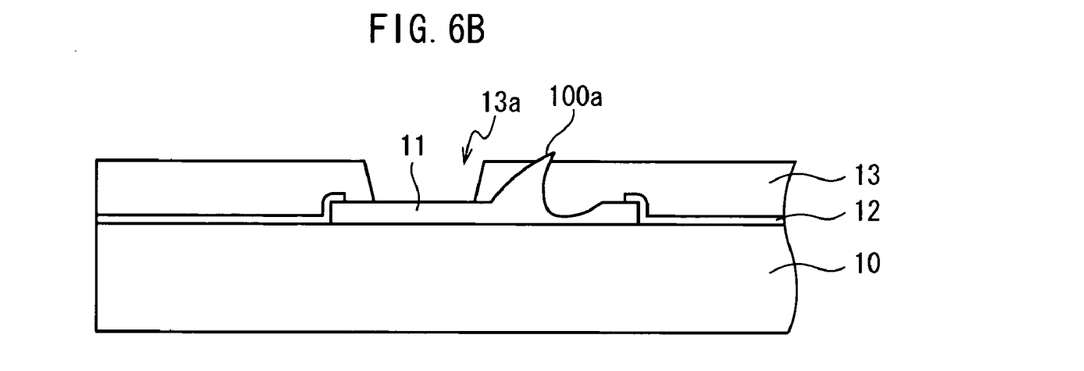

Next, PBO in a liquid state is coated on the semiconductor substrate 10 by spin coating. The coated PBO is uniformly supplied onto the surface of the semiconductor substrate 10. After that, the semiconductor substrate 10 is conveyed into an $N_2$ atmosphere furnace of about 300° C. and subjected to curing process for about one hour. By the processes, the insulating film 13 having a thickness of 1 to 10 μm, preferably, about 5 μm is formed on the surface of the semiconductor substrate 10. At this time, in the case where the height of the projected probe mark 100 formed in the electrode pad 11 exceeds the thickness of the insulating film 13, the tip portion of the probe mark 100 projects from the surface of the insulating film 13. That is, at least a lower part of the probe mark 100 is covered with the insulating film 13. After that, the insulating film 13 is partially removed by photolithographic and etching processes, thereby forming an opening 13*a* in a part corresponding to the contact region 11*a* in the electrode pad 11. The contact region 11*a* in the electrode pad 11 is exposed from the opening 13*a* (FIG. 6B). As the material of the insulating film 13, polyimide can be also used. In this case, polyimide in a liquid state is coated on the semiconductor substrate 10 by spin coating and, after that, the curing process of about one hour is performed in the $N_2$ atmosphere furnace of about 350° C. By the processes, the insulating film 13 having a thickness of 1 to 10 μm, preferably, about 4 μm is formed on the surface of the semiconductor substrate 10.

Figure 6C:
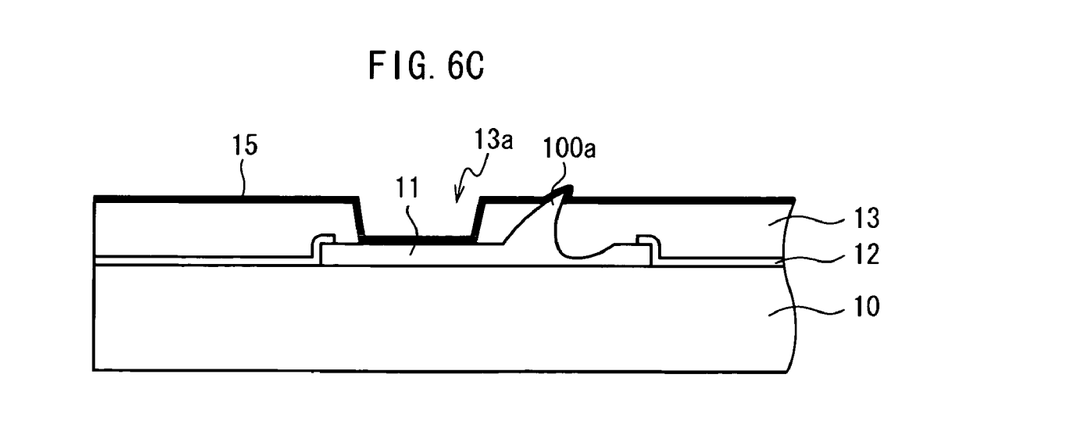

Next, on the insulating film 13, a barrier layer made of Ti or the like and a seed layer made of Cu or the like are sequentially deposited by sputtering, thereby forming the UBM film 15. The UBM film 15 covers the contact region 11*b* in the electrode pad exposed in the opening 13*a* in the insulating film 13, the side walls of the opening 13*a*, and the tip portion of the probe mark 100 projected from the surface of the insulating film 13. The part of the probe mark 100 covered by the UBM film 15 is limited to the tip portion of the projection, so that the UBM film 15 can be uniformly formed in the part (FIG. 6C).

Figure 6D:
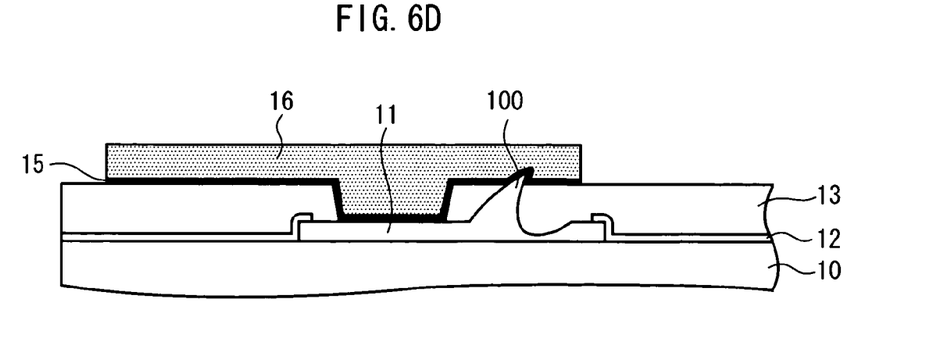

Next, a resist mask corresponding to the pattern of the rewiring layer 16 is formed on the UBM film 15, and the rewiring layer 16 made of Cu and having a predetermined wiring pattern is formed on the UBM film 15 by electrolytic plating. Subsequently, the resist is peeled off and the UBM film 15 residing under the resist is removed by etching. The rewiring layer 16 is connected to the electrode pad 11 in the opening 13*a* in the insulating film 13. By the patterning, the rewiring layer 16 has a part extending above the test region 11*b* in the electrode pad 11 while sandwiching the part which is in contact with the electrode pad 11, and a part extending below a region where the solder bump 19 is to be formed in a process later. As a result, the tip of the projection of the probe mark 100 formed in the test region 11*b* in the electrode pad 11 is covered with the rewiring layer 16 (FIG. 6D).

Figure 6E:
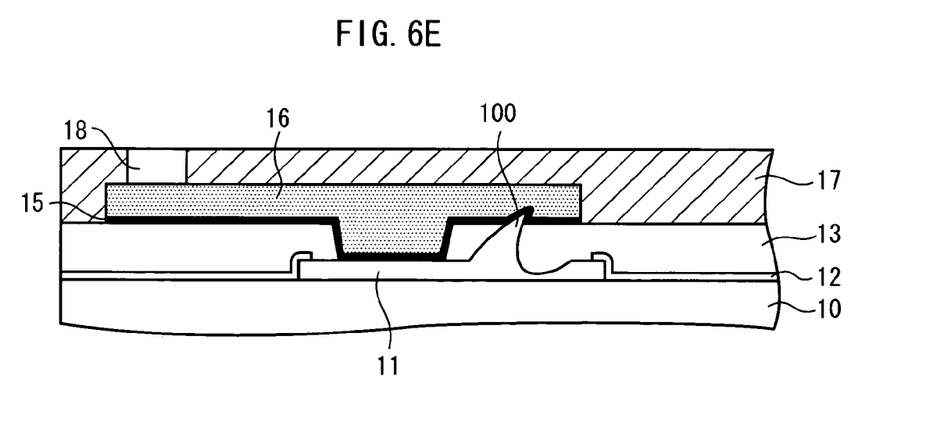
Figure 6F:
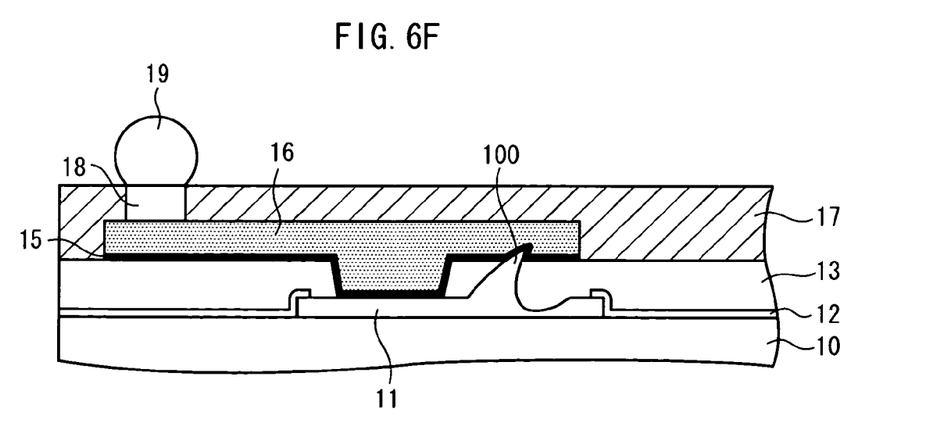

Next, the columnar electrode (Cu post) 18 made of Cu or the like is fixed to the end of the rewiring layer 16. Subsequently, the surface of the semiconductor substrate 10 is covered with the encapsulation resin 17 so as to bury the columnar electrode 18. The encapsulation resin 17 is made of an epoxy resin or the like and can be formed by using a general mold apparatus. The surface of the encapsulation resin 17 is ground to expose the columnar electrode 18 buried on the inside. The solder bump 19 is connected to the top surface of the columnar electrode (Cu post 18) exposed from the surface of the encapsulation resin 17 (FIG. 6E). By the above processes, the semiconductor device of the embodiment is completed.

As obvious from the above description, in the semiconductor device and the method of fabricating the semiconductor device of the invention, not only the insulating film but also the rewiring layer are formed above the test region in the electrode pad with which the test probe comes into contact in the process of testing the semiconductor substrate. Consequently, even in the case where a projected probe mark having relatively large height is formed due to the wafer test performed plural times, and the tip of the projection of the probe mark projects from the surface of the insulating film, the part is covered with the rewiring layer. Therefore, direct contact between the electrode pad and the insulating resin via the projection of the probe mark can be prevented. Even in the case where moisture enters the package, progress of corrosion of the electrode pad can be suppressed, so that high reliability can be assured.

In addition, since at least a lower part of a projected probe mark is covered with the insulating film, a part to be covered with the rewiring layer is limited to a tip portion of the probe mark. Therefore, even in the case where the height of the projection of the probe mark increases, the tip portion of the probe mark projected from the insulating film can be reliably covered with the rewiring layer. That is, in a circumstance that an electric test is conducted on a semiconductor substrate plural times, higher reliability can be assured as compared with the structure shown in FIG. 4 that the electrode pad is covered only with the rewiring layer.

Figure 7A:
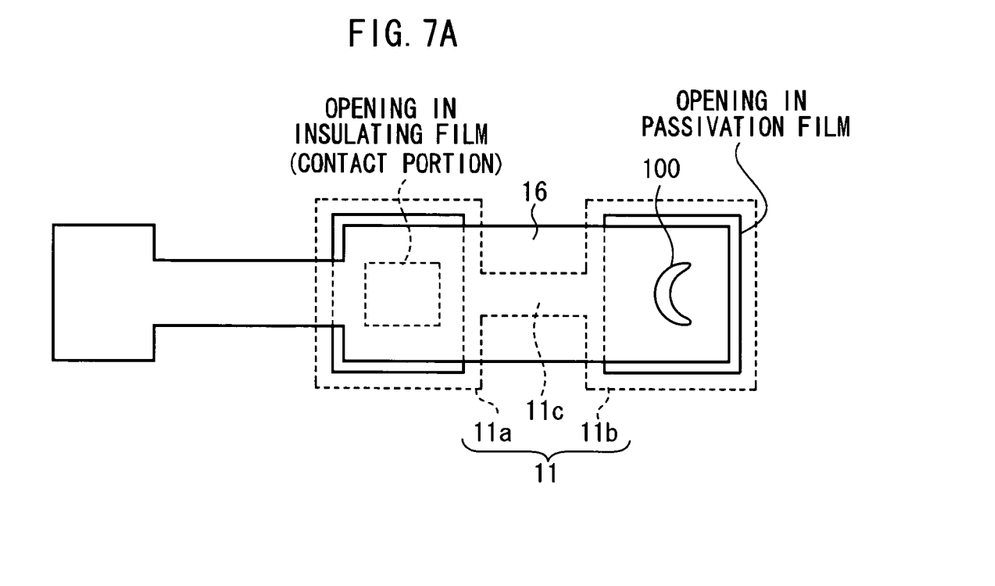
FIG. 7A is a plan view showing the configuration of an electrode pad formation part in a semiconductor device as another embodiment of the invention.
Figure 7B:
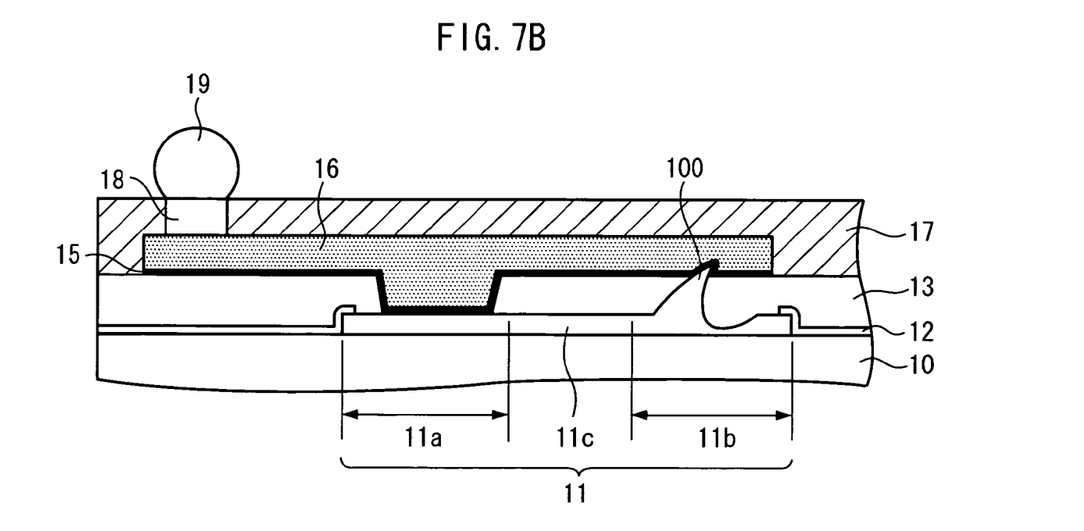
FIG. 7B is a cross section taken along line 7b-7b in FIG. 7A.
Figure 8A:
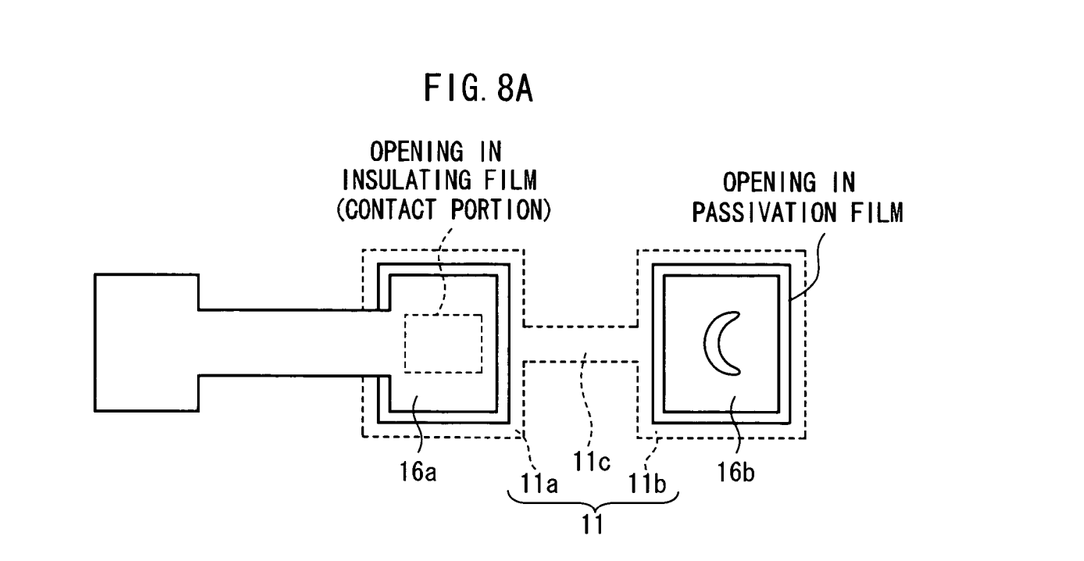
FIG. 8A is a plan view showing the configuration of an electrode pad formation part in a semiconductor device as another embodiment of the invention.
Figure 8B:
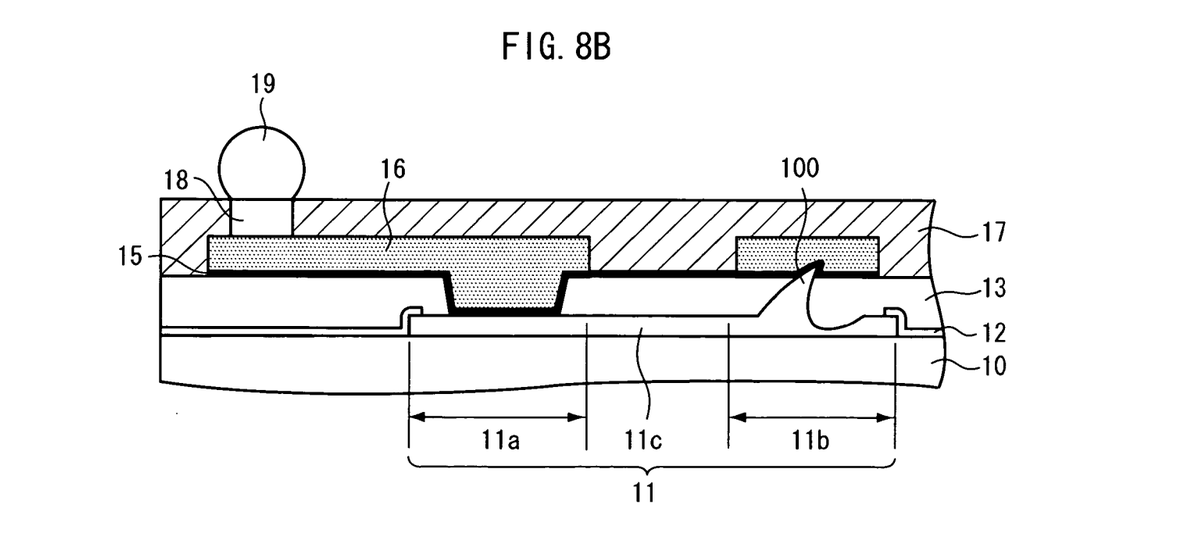
FIG. 8B is a cross section taken along line 8b-8b in FIG. 8A.

FIGS. 7A and 7B and FIGS. 8A and 8B show other embodiments of the semiconductor device of the invention. FIGS. 7A and 8A are plan views each showing the configuration of an electrode pad formation part in a semiconductor device as another embodiment of the invention. FIG. 7B is a cross section taken along line 7*b*-7*b* in FIG. 7A, and FIG. 8B is a cross section taken along line 8*b*-8*b* in FIG. 8A. In the plan views of FIGS. 7A and 8B, the components such as the solder bump 19, the columnar electrode 18, and the mold resin 17 are not shown.

In the foregoing embodiment, an example of the structure in the case where the device has the electrode pad 11 in which the contact region 11a and the test region 11b are integrally and continuously formed has been described. The invention can be also applied to a semiconductor substrate having an electrode pad 11 in which the contact region 11a and the test region 11b are disposed so as to be apart from each other as shown in FIGS. 7A and 7B. Specifically, the contact region 11a and the test region 11b in the electrode pad 11 disposed so as to be apart from each other are electrically connected to each other via a conductive wire 11c made of Al or the like. Over the semiconductor substrate 10 having the electrode pad 11 of such a configuration, the insulating film 13 and the rewiring layer 16 extend so as to cover the regions in the electrode pad. In a manner similar to the foregoing embodiment, the contact region 11a is connected to the rewiring layer 16 in the opening in the insulating film 13. The semiconductor device having such a structure can also obtain an effect similar to that of the foregoing embodiment.

As shown in FIGS. 8A and 8B, in the rewiring layer, a part 16a covering the contact region 11a from above and a part 16b covering the test region 11b from above may be separated from each other. The semiconductor device having such a structure can also obtain an effect similar to that of the foregoing embodiment.

What is claimed is:

1. A semiconductor device including a semiconductor substrate on which at least one electrode pad is formed, a rewiring layer connected to the electrode pad, and an encapsulation part which encapsulates the semiconductor substrate, the electrode pad being formed of a first region including a connection part connected to the rewiring layer and a second region having a projection formed by contact of a probe, the device comprising:
   an insulating film provided on the semiconductor substrate, having an opening at which the first region of the electrode pad is exposed, and covering at least a lower part of the projection,
   wherein the rewiring layer is connected to the first region of the electrode pad exposed at the opening and extends across the insulating film so as to cover an upper part of the projection projected from a surface of the insulating film.

2. The semiconductor device of claim 1, further comprising at least one external connection terminal provided on the surface of the encapsulation part and connected to the rewiring layer, wherein:
   the first region of the electrode pad is disposed in a position closer to the external connection terminal than the second region; and
   the rewiring layer has a first extension part extending toward the external terminal while sandwiching the connection part, and a second extension part extending toward the second region of the electrode pad.

3. The semiconductor device of claim 2, wherein the rewiring layer ends at a position at which a distance in an extension direction of the second extension part between an end of the second extension part and an end on the second region of the electrode pad is smaller than 25 µm.

* * * * *